United States Patent [19]

Kniffler et al.

[11] Patent Number: 4,769,546

[45] Date of Patent: Sep. 6, 1988

[54] DIGITAL POSITION TRANSMITTER

[75] Inventors: Norbert Kniffler, Egmating; Wolfgang Legner, Munich, both of Fed. Rep. of Germany

[73] Assignee: Messerschmitt-Bölkow-Blohm GmbH, Munich, Fed. Rep. of Germany

[21] Appl. No.: 14,680

[22] Filed: Feb. 13, 1987

[30] Foreign Application Priority Data

Feb. 18, 1986 [DE] Fed. Rep. of Germany ....... 3605141

[51] Int. Cl.$^4$ .............................................. G01T 1/24
[52] U.S. Cl. ........................... 250/370.01; 250/203 R
[58] Field of Search .......... 250/370 H, 370.10, 370 K, 250/370 G, 370 C, 370 A, 370 R, 390 K, 332, 203 S, 203 R

[56] References Cited

U.S. PATENT DOCUMENTS

| | | | |
|---|---|---|---|
| 3,440,426 | 4/1969 | Bush | 250/203 R |
| 3,562,528 | 2/1971 | Joyce | 250/370 H |
| 4,439,672 | 3/1984 | Salaman | 250/231 SE |
| 4,499,374 | 2/1985 | Kabaya | 250/237 G |

FOREIGN PATENT DOCUMENTS

| | | |
|---|---|---|
| 2333698 | 9/1974 | Fed. Rep. of Germany . |
| 2335942 | 1/1975 | Fed. Rep. of Germany . |
| 3220560 | 12/1982 | Fed. Rep. of Germany ... 250/237 G |
| 3205402 | 9/1983 | Fed. Rep. of Germany . |

OTHER PUBLICATIONS

"Striped Semiconductor Detectors for Digital Position Encoding", by E. L. Haase et al., *Nuclear Instruments and Methods*, vol. 97, No. 3, (1971), pp. 465–469.

Primary Examiner—Janice A. Howell
Assistant Examiner—William F. Rauchholz
Attorney, Agent, or Firm—Kenyon & Kenyon

[57] ABSTRACT

A position transmitter which determines the point of incidence of a light or particle beam on a sensor array, and the output signal of which gives the point of incidence in a digital code. The position transmitter comprises a sensor array having diodes which are arranged on a substrate and are connected at least partly to each other as well as to a digital bus, of which a part of the array generates electron-hole pairs if the light or particle beam strikes, and another part of the diode array arranged in accordance with the desired code is switched off in its function.

8 Claims, 4 Drawing Sheets

DIGITAL POSITION TRANSMITTER

BACKGROUND OF THE INVENTION

The present invention relates to a position transmitter which determines the point of incidence of a light or particle beam for determining position.

Such position transmitters can be used, for instance, as length, area, coordinate, angle or velocity pickups.

Since such position transmitters are frequently used in equipment in which the further processing of the position signal takes place digitally, a series of position transmitters has been developed, in which the position of the light beam is read out in a digital code.

Position transmitters which read out the position of a light beam digitally and can be used, for instance, as either angle or length pickups are known, for instance, from German Patent Nos. 23 33 698, 23 35 942, or U.S. Pat. No. 4,439,672. In these position transmitters, a code disc or a code scale is used which, corresponding to the desired code, has regions which influence the incident light beam differently. This code disc or code scale is relatively movable with respect to a light receiver which is frequently equipped also with a scanning grid. In this manner, the position of the incident light beam can be read out in a digital code, for instance, a binary code, Binary Coded Decimal (BCD) or a Gray code or in another code.

From DE-OS No. 32 20 560, a photoelectric encoder has become known in which two optical grids are moved relatively to each other. One of the two grids is integrated here in the semiconductor material in which also the light receiving device is formed.

Although these known position transmitters can be fabricated comparatively cost-effectively, they have the disadvantage that they require mechanically moved parts which are trouble-prone particularly under rough environmental conditions.

Various proposals for position transmitters have therefore become known which give the point of incidence of a light or particle beam absolutely and digitally, and make do without moving parts.

In one of these proposals, a CCD (charge coupled device) is used. However, it is a disadvantage when CCD arrays are used, that the location information can be called up only serially, and that comparatively complicated electronic circuitry is required for reading the location information out.

Thus, in such systems, not only the amount of structural means is comparatively large; in addition, they also do not meet the increased speed requirements.

A further digital position transmitter has become known from DE-OS No. 32 05 402. In this digital position transmitter, a multiplicity of sensors are connected via operational amplifiers with special feedback arrangements to the lines of a digital bus. It is achieved by the feedback arrangements that the signal on the digital bus indicates the point of incidence in a digital code.

This digital length transmitter is very complicated particularly due to the use of an operational amplifier with a special feedback arrangement as well as of a transistor with several emitter terminals for each sensor, so that it has not yet been realized in practice to date.

SUMMARY OF THE INVENTION

It is therefore an object of the present invention to provide a position transmitter which indicates the point of incidence of a light and particle beam directly in a digital code, is of relatively simple design and can be realized particularly easily as an integrated circuit.

The above and other objects of the present invention are achieved by a position transmitter which determines the point of incidence of a light or particle beam on a sensor array, and the output signal of which gives the point of incidence in a digital code, the sensor array comprising a plurality of diode means arranged on a substrate and connected, at least in part, to each other and to a digital bus, part of the diode means generating electron-hole pairs upon the impingement of the light or particle beam, and another part of the diode means arranged in accordance with the desired code being functionally switched off.

According to the invention, the position transmitter comprises a multiplicity of diodes which are arranged on a substrate and are connected, at least in part, to each other as well as to the lines of a digital bus. Of these diodes, only part generates electron-hole pairs upon the incidence of the light or particle beam, while another part is functionally switched off for the readout of the point of incidence according to the desired code. The arrangement of the functionally disconnected part of the diodes depends here on the desired code. The readout of the point of incidence can be accomplished here directly, for instance, by binary coding or by a Gray code.

Since it consists only of diodes, the position transmitter according to the invention is easy to manufacture and is suitable particularly for fabrication by known methods of semiconductor technology, by which diodes with high packing density can be manufactured in or on a substrate.

Particularly advantageous, however, is the fabrication of diodes of amorphous silicon on a glass or metal substrate with transparent contacting oxide ('TCO') strips. Thereby, also large-area sensor arrays can be fabricated cost-effectively. Since the point of incidence of the beam is read-out in parallel via a bus without the need of electronic read-out circuitry, the position transmitter according to the invention can be employed in velocity-critical systems such as, for instance, target-search equipment or travel-distance sensors for robot applications.

In any case, it is advantageous, however, if part of the diodes is connected to a trigger line: depending on the design, it can be indicated by a signal or a pulse on the trigger line whether a particle beam is present at all or whether the particle beam has changed its position.

Further embodiments of the position transmitters according to the invention are also described in one embodiment, the position transmitter is particularly well suited for determining the point of incidence of a beam with elongated cross section. To this end, the diodes in the individual array rows are connected parallel and are made insensitive or sensitive to radiation, according to the desired code. The array rows are perpendicular to the "long cross section axis" of the incident beam. The number of array rows corresponds to the number of, "bits," i.e., to the desired resolution of the digital readout of the point of incidence.

The pattern, in which the radiation-sensitive or insensitive diodes are arranged can here be of such a nature that the output of the point of incidence is, for instance, binary-coded or in Gray code.

The beam-sensitive or insensitive quality of the individual diodes can be produced by destruction of individual diodes or by selective coverage of the diodes against the incident radiation.

A particularly simple design of the position transmitter is obtained by the provision that the individual array rows are formed by respective strip diodes which are made selectively radiation-sensitive or insensitive by appropriate coverage.

Such a strip diode can be made particularly simply by applying amorphous silicon to a glass or metal substrate.

In another embodiment, the design of the position transmitter according to the invention is particularly well suited for determining a light or particle beam with "point-shaped" cross section, i.e., with a cross-sectional area which is equal to or smaller than the radiation-sensitive area of the individual diodes. In this embodiment, the radiation-sensitive diodes are connected to the individual lines of a digital bus via diodes connected in series with opposite polarity. By selectively disconnecting the function of these diodes establishing the connection, a signal corresponding to the desired code is obtained on the bus.

This embodiment is suitable for fabricating linear or matrix sensors. Large sensor arrays of this embodiment can also be fabricated cost-effectively in thin-film technology.

BRIEF DESCRIPTION OF THE DRAWINGS

The invention will be described in greater detail in the following detailed description, with reference to the drawings in which.

DETAILED DESCRIPTION

Figure 1:
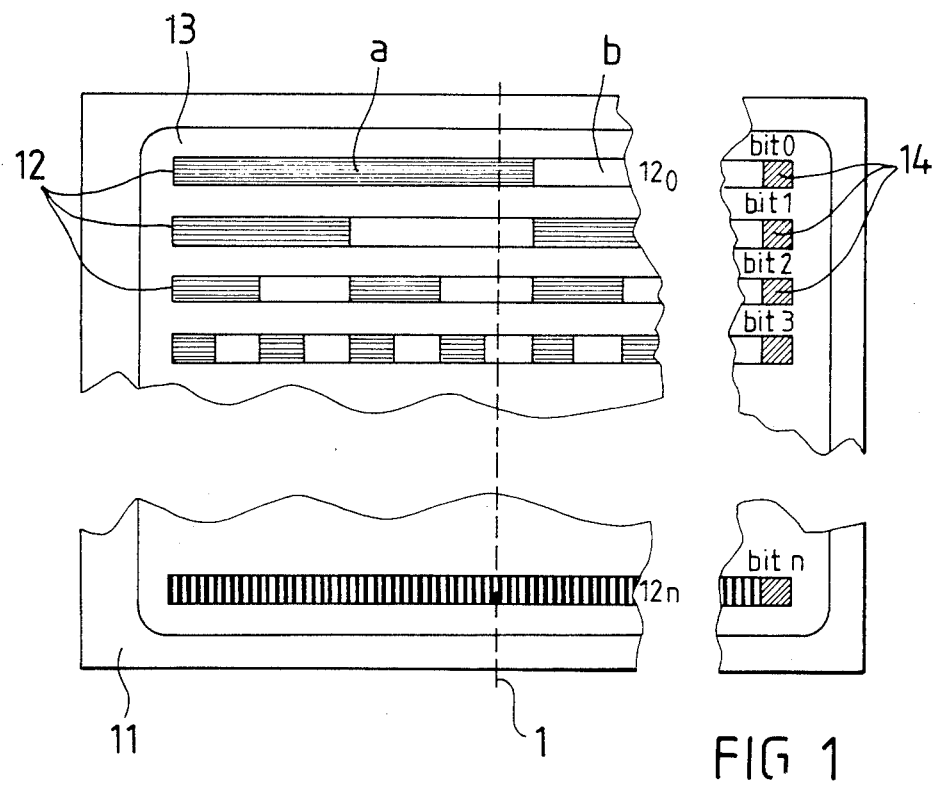
FIG. 1 is a top view of a first embodiment of the invention.
Figure 2:
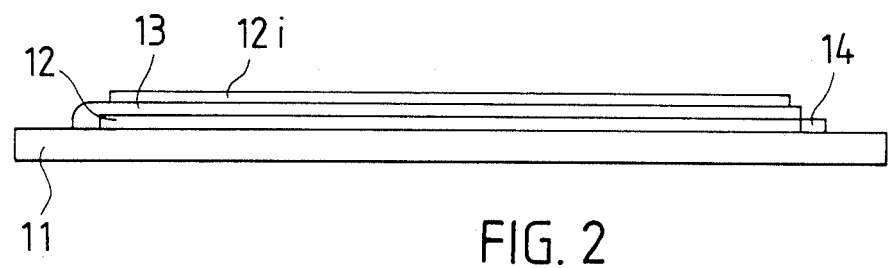
FIG. 2 shows the basic diagram of a second embodiment of the invention as a one-dimensional sensor row.

With reference now to the drawings, FIGS. 1 and 2 show a top view and a cross section, respectively, through a first embodiment of the invention which is suitable for determining the position of a strip-shaped light beam (1) (shown only schematically). To the substrate (11) which comprises glass and through which the light beam (1) falls, TCO (transparent contacting oxide) is applied. The number of TCO strips (12) corresponds to the desired resolution "in bits." An amorphous silicon layer (13)(alpha-silicon) is placed on the substrate (11) or the TCO strips (12). The alpha-silicon layer (13) is contacted in strip-fashion by TCO strips ($12_0$ to $12_n$), so that strip-shaped photodiodes are obtained. The contact arrangement on the top side of the silicon layer (13), however, is designed so that the strip diodes formed are in part light-sensitive and in part not light-sensitive. This can be achieved, for instance, by the provision that an insulating layer, for instance, of silicon nitrite, is applied under part of the strips or that the nonoperational strip regions are fabricated by light degradation with masks, or that light is shielded by a metal coating. The topmost row strip ($12_0$) which represents the bit 0, is subdivided in one-half into a functioning strip region (region a) and into a nonfunctioning strip region (region b). Similarly, the second strip which represents "bit 1" is subdivided into two functioning and two nonfunctioning strip regions, etc. If now the photocurrent is taken up at the end of the strip at contacts (14) a signal or no signal is obtained, depending on the position of the light beam (1). By the chosen subdivision into functioning and nonfunctioning strip regions, the position of the light beam (1) is obtained in binary coded form at the contacts (14).

If the subdivision into functioning and nonfunctioning (light-sensitive and light-insensitive) regions were made in different form, the position would be read out at the metal contacts (14) in a different code, for instance, in "Gray code". By appropriate division of the strip-shaped photo diodes into functioning and nonfunctioning regions, also encoding etc. can be realized.

In any case, a position transmitter is obtained which indicates the point of incidence of a strip-shaped light or particle beam in a digital code without the need for additional circuit measures or measures for reading-out the signals. The embodiment shown in FIGS. 1 and 2 is suitable not only for determining the one-dimensional position of a light or particle beam in one plane. A goniometer can rather also be realized in a simple manner. To this end, the parallel "strip diodes" subdivided into functioning and nonfunctioning regions are placed on a "cylinder". In this connection it may be advantageous if the light beam does not fall through the substrate but through the strips which are applied to the top side of the silicon layer (12) and which can then be realized as TCO strips with a partly opaque covering. If the light falls through the strips (13), the substrate can also be realized as a metal substrate.

While the first embodiment shown in FIGS. 1 and 2 has the advantage that its output signal gives the position of the light or particle beam as a digital code without additional circuitry, it has the disadvantage that the light and/or particle beam must have an elongated and in particular, a strip-shaped cross section.

Figure 3:
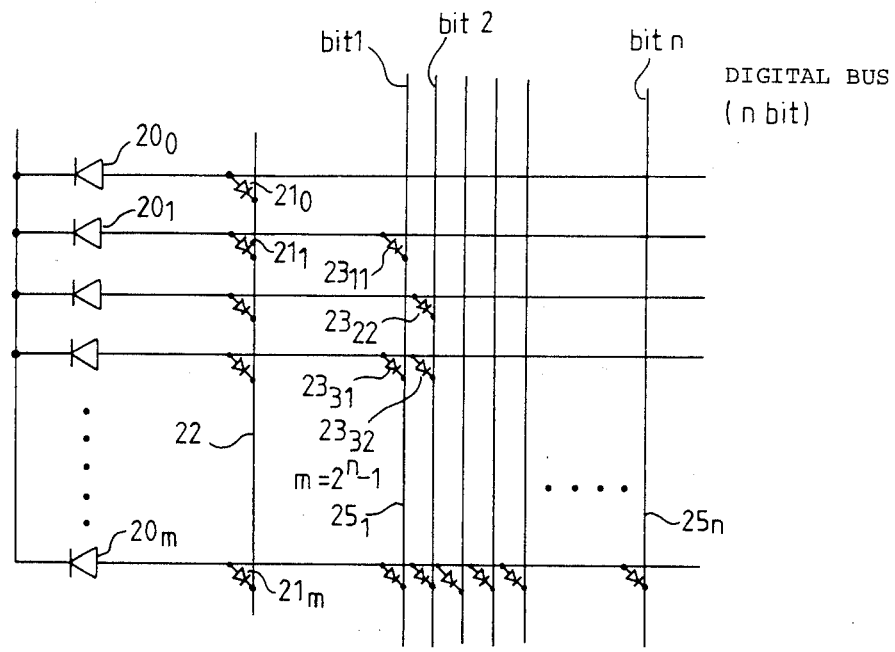
FIG. 3 is a cross section through a realization of the embodiment shown in FIG. 2.
Figure 4:
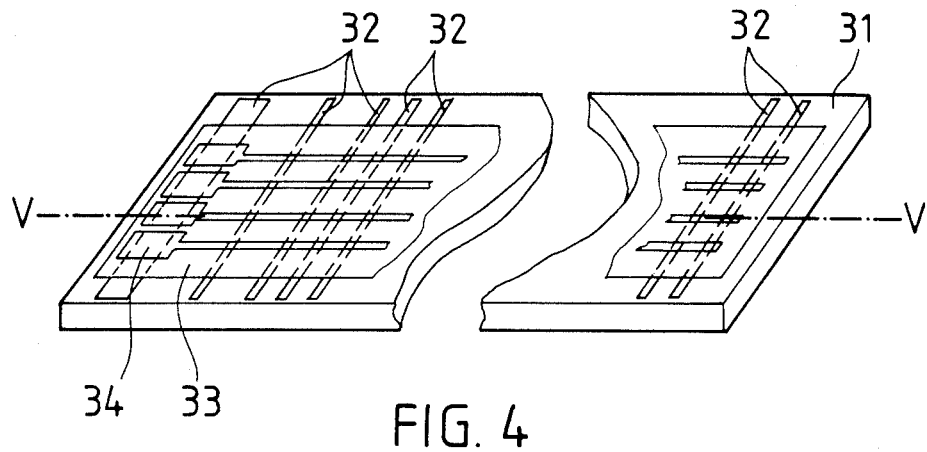
FIG. 4 is a basic diagram of the second embodiment of the invention as a two-dimensional sensor array.
Figure 5:
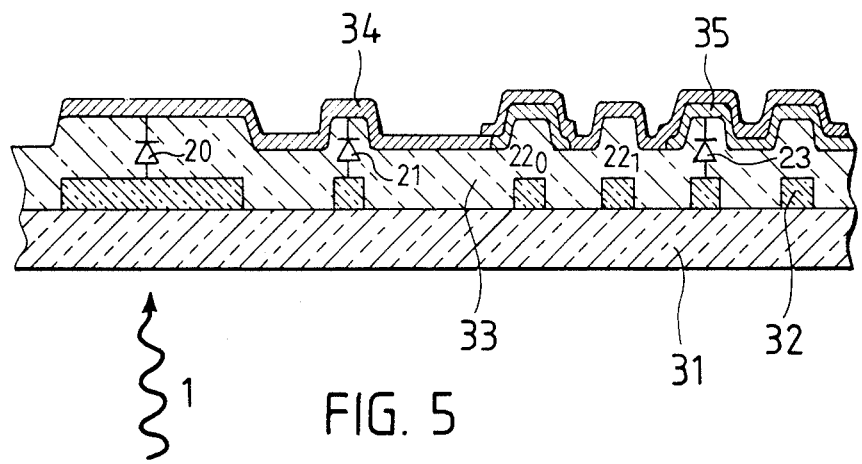
FIG. 5 shows an application of the position transmitter according to the invention.

FIGS. 3 to 5 show a second embodiment of the invention which determine the position of an (idealized) point-shaped light or particle beam on a sensor row and reads it out in a digital code which is almost freely selectable.

FIG. 3 shows a block diagram of the invention. In this embodiment, m+1 photo diodes ($20_0$ to $20_m$) are arranged in rows. Each photo diode (20) is connected to a trigger line (22) via a photo diode ($21_0$ to $21_m$) connected in series with the opposite polarity. A signal on the trigger line (22) indicates that a light or particle beam impinges on one of the photo diodes (20). In addition, the individual photodiodes ($20_0$ to $20_m$) are connected to the n-lines ($25_1$ to $25_n$) of a digital bus n bits wide via photo diodes ($23_{11}$, $23_{22}$, $23_{31}$, $23_{32}$, etc.) connected in series with the opposite polarity.

The position transmitter, the basic diagram of which is shown in FIG. 3, can be operated as a photoelectric element as well as with an applied blocking voltage. The mode of operation as a photoelectric element (or also a series circuit of photoelectric elements or module) is obtained by connecting the photodiodes (20) to reference potential on the cathode side; the photoelectric voltage which is present at the anode and is generated by the incident "light spot" is passed on to the bus via the diodes (23) according to the digital code set by the wiring.

The other mode of operation is obtained by connecting the photodiodes (20) to positive potential on the cathode side. By the illumination of a photodiode, a photo current in the cutoff direction is generated which is likewise passed-on to the digital bus through the diodes (23).

The desired digital code can be selected by the arrangement of the diodes (23) which pass-on the photocurrent or the photoelectric voltage, respectively, to the digital bus. In FIG. 3, an arrangement is shown which leads to a binary coding of the position of the light spot.

FIGS. 4 and 5 show a practical realization of the second embodiment shown in principle in FIG. 2; FIG. 4 shows a top view and FIG. 5, a cross section along the line V—V in FIG. 4.

On a glass substrate (31), through which the "point-shaped" light beam (1) falls, TCO strips (32) are applied in the same manner as in the first embodiment shown in FIGS. 1 and 2, which define the photo diodes (20), the diodes (21) as well as the diodes (23). To the glass substrate (31) or the TCO strips (32), amorphous silicon (33) is applied again. On the top side of the amorphous silicon layer (33), metallization strips (34) are applied perpendicularly to the TCO strips (32). Since, as shown in FIG. 3, different photodiodes should not be connected to different bus lines, those diode matrix points which should not make connection and therefore always have the logical value "0" are covered by an insulating layer (35) consisting, for instance, of silicon nitride. Thereby, a basic diagram shown in FIG. 3, is obtained with a regular diode structure which is easy to produce and by which a position transmitter is realized which reads out the point of incidence of a "point-shaped" light beam in a digital code. This code can be chosen by the provision that the function of certain diodes which connect the photo diodes to the digital bus, is switched off.

Figure 6:
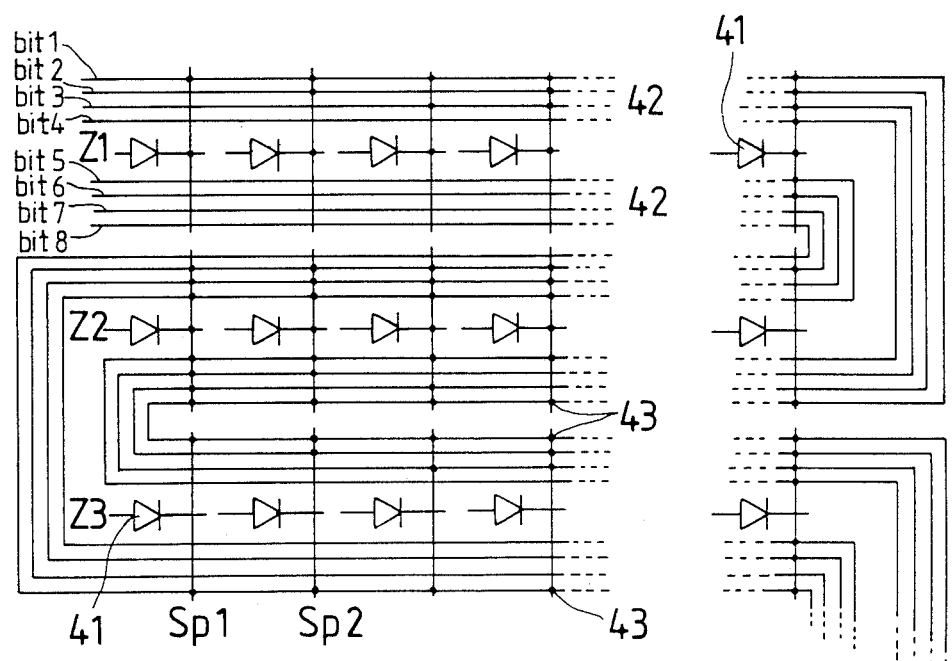
FIG. 6 is a basic diagram of a third embodiment.

FIG. 6 shows a basic diagram of a third embodiment. This embodiment represents a modification of the second embodiment and makes possible two-dimensional determination of the position of the light or particle beam.

Photodiodes (41) arranged in the shape of a matrix are connected to the lines of a bus (42) n bits wide via photo diodes connected in series with opposite polarity which are symbolized by dots in FIG. 6. As in the second embodiment, the photo voltage or the photo current produced is passed-on from the photo diode to the bus via the appropriate matrix diode.

In the embodiment shown in FIG. 6, a bus 8 bits wide is used, bit 1 being used as the trigger. Bits 2 to 8 are used for row and column coding, bits 2 to 6 representing the column number (0 to 31) and bits 7 to 8, the row number.

Also, this embodiment can be realized by a thin-film circuit according to FIGS. 4 and 5, so that an in-depth description can be dispensed with.

The position transmitters according to the invention which were explained in conjunction with FIGS. 1 to 6, have a multiplicity of possible applications. For instance, they can he used as distance sensors for automatic handling machines, as pickups for compensation-type recorders or as X/Y cross slides as well as for target searching equipment. They can, of course, also be employed in all applications in which length or angle pickups are used which furnish an analog output signal.

Figure 7:
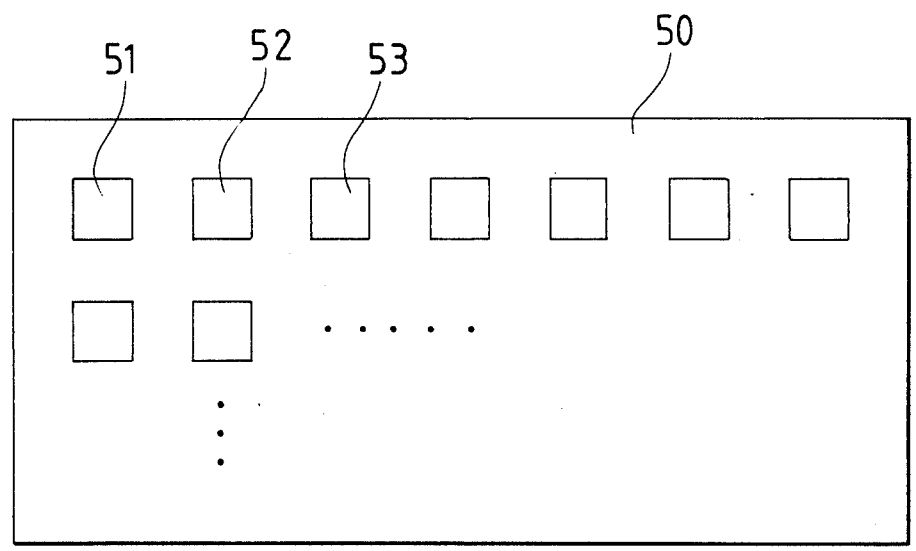
FIG. 7 shows a keyboard as a possible application of the invention.

FIG. 7 shows a keyboard as a possible application of a position transmitter according to the invention. The outer keyboard is a glass plate 50, which is equipped with an $SnO_2$ layer. On the $SnO_2$ layer, structured alpha-silicon sensors 51, 52, 53 . . . are applied which accomplish the digital output signal processing. Because the active structures behind the glass plate can be produced by laser segmentation, an easy-to-handle key arrangement is also conceivable. The glass plate also provides excellent protection of the keyboard against dust, moisture, acids and mechanical wear.

Figure 8:
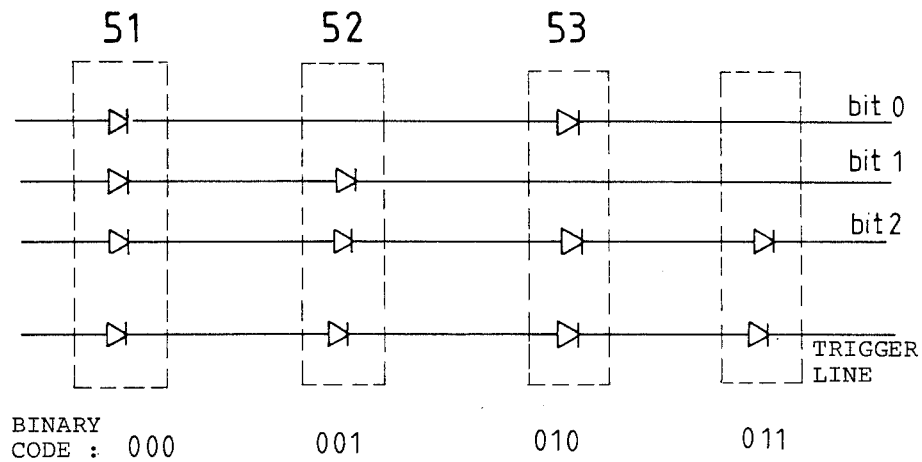
FIG. 8 is a basic diagram of the keyboard shown in FIG. 7.

FIG. 8 serves for explaining the electronic operating principle. In the rest condition, all sensors are illuminated. This means that a logical "1" appears at all outputs. If, for instance, the key 51 is "depressed", all three series circuits are interrupted and all outputs are at the value "0". If, for instance, the key 53 is operated, only bit 0 and bit 2 go to "0" because there is no diode in the bit-1 line.

A trigger line is most simply obtained by drawing a series circuit of sensors through all keys.

The key sensors can be structured by the same methods as are used in the fabrication of alpha-silicon thin-film circuits, i.e., for instance, by laser structuring or by photolithography.

One application therefore is a miniature keyboard which furnishes a direct digital code.

A further application is the use of light gates which deliver a digital code, whereby the sensor is identified on a single bus line by the computer almost without expense.

The sensors can be made independent of power supplies, since a "solar module" can be integrated.

In the above, the invention has been described with the aid of embodiments without limitation of generality. Within the general idea of the invention to realize a position transmitter which gives the point of incidence of a light or particle beam in a digital code directly by using a sensor array which consists of diodes which are at least partly connected to each other as well as to the digital bus, the most different modifications are, of course, possible.

For instance, only realizations in the so-called thin-film technology were described above. The diode arrangement can, of course, be realized also by other production methods; for instance, PN structures or Schottky junctions can be used instead of PIN structures. Switching off individual diodes which are not supposed to make connections between the sensor diodes and the digital bus, can be accomplished in various ways.

In the realization of the different matrix diodes in thin-film technology, the substrate can consist not only of glass with applied TCO strips, but also of a metal. The TCO strips can then be provided on the top side of the silicon layer through which the light or particle beam then falls.

The TCO strips can be applied by various production method, for instance, by etching or laser segmentation, or also by the well-known TCO fabricating process.

What is claimed is:

1. A position transmitter for determining the point of incidence of a light or particle beam on a sensor array, and the output signal of which gives the point of incidence in a digital or other desired code, wherein the sensor array comprises a plurality of diode means arranged on a substrate and connected, at least in part to each other and to a digital bus, part of the diode means generating electron-hole pairs upon the impingement of the light or particle beam, and another part of the diode means being arranged in accordance with the desired code being functionally switched off.

2. The position transmitter recited in claim 1, wherein the diode means are arranged regularly and in particular, in the form of a matrix.

3. The position transmitter recited in claim 1, wherein a further part of the diode means is connected to a trigger line.

4. The position transmitter recited in claim 1, wherein, for determining the point of incidence of a beam with elongated cross section, the other part of the diode means comprises individual array rows which are connected in parallel and are designed sensitive or insensitive, depending on the desired code.

5. The position transmitter recited in claim 4, wherein a strip diode forms the respective individual array rows which are covered up selectively against the incident light or particle beam.

6. The position transmitter recited in claim 5, wherein the strip diode is prepared by applying amorphous silicon to a glass or metal substrate with transparent contacting oxide ('TCO') strips.

7. The position transmitter recited in claim 1, wherein the light or particle beam sensitive diodes are connected to the individual lines of a digital bus by respective diodes which are connected in series with opposite polarity and which are switched off selectively in accordance with the desired code.

8. The position transmitter recited in claim 7, wherein both the light or particle beam sensitive diodes and the respective diodes are prepared by applying amorphous silicon to a glass substrate with transparent contacting oxide ('TCO') strips and corresponding insulation or by contacting on an opposite side.

* * * * *